United States Patent [19]

Fraleux

[11] 4,166,956

[45] Sep. 4, 1979

[54] DEVICE FOR DETECTING THE DEFLECTION SIGNAL OF THE ELECTRON BEAM GENERATED BY AN ELECTRON-GUN IN AN OSCILLOSCOPE

[75] Inventor: Jean Fraleux, Paris, France

[73] Assignee: Thomson-CSF, Paris, France

[21] Appl. No.: 862,402

[22] Filed: Dec. 29, 1977

[30] Foreign Application Priority Data

Dec. 23, 1976 [FR] France .................. 76 38892

[51] Int. Cl.² .............................................. G01T 1/22
[52] U.S. Cl. .................................................. 250/370
[58] Field of Search .............. 250/370, 371, 396, 397, 250/398; 313/364

[56] References Cited

U.S. PATENT DOCUMENTS

| | | | |
|---|---|---|---|
| 3,529,161 | 9/1970 | Oosthoek et al, .................... | 250/370 |
| 3,928,768 | 12/1975 | Crowell .............................. | 250/370 |

Primary Examiner—Bruce C. Anderson
Attorney, Agent, or Firm—Roland Plottel

[57] ABSTRACT

A device for detecting the detection signal of the electron beam produced by an electron gun provided with a target on a semiconductor material. The target is scanned by the electron beam when operating. The target is provided upon one of its faces with a series of semiconductor elements generating electrical charge carriers under the effect of bombardment by the electron beam. The semiconductor elements are arranged, considered in the direction of scanning of the beam, to form an array of elementary generators. The array of elementary generators is designed to form two rows of elementary generator means. The rows are separated by a zone which is insensitive to the high energy electron beam when the latter is focused on that insensitive zone in the quiescent state. The information from the corresponding elementary generator is furnished in operation by sequential read out of the elementary generators.

12 Claims, 5 Drawing Figures

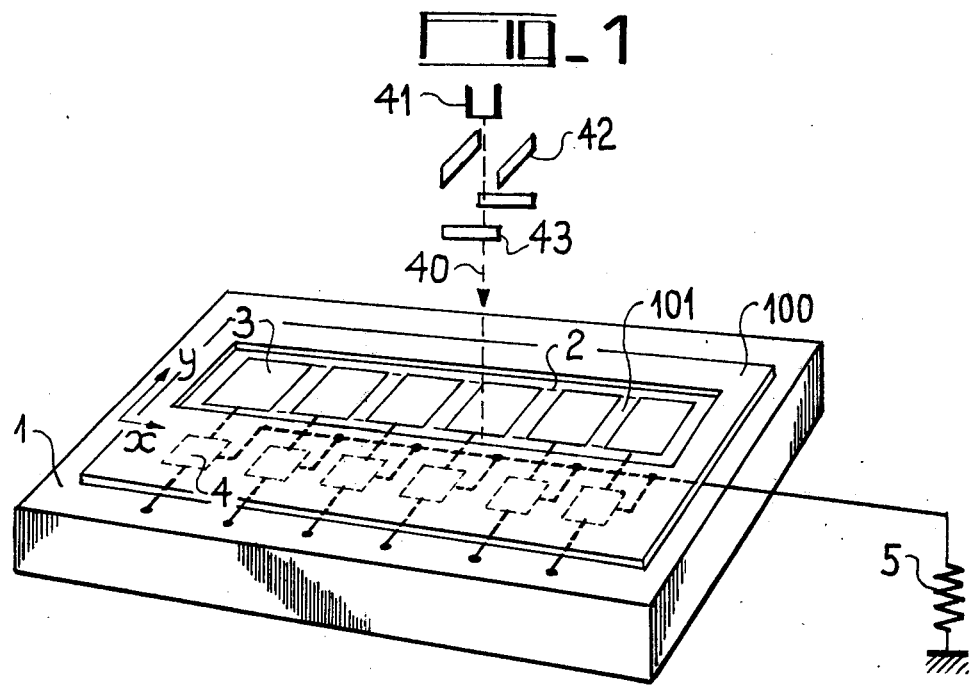
FIG_1
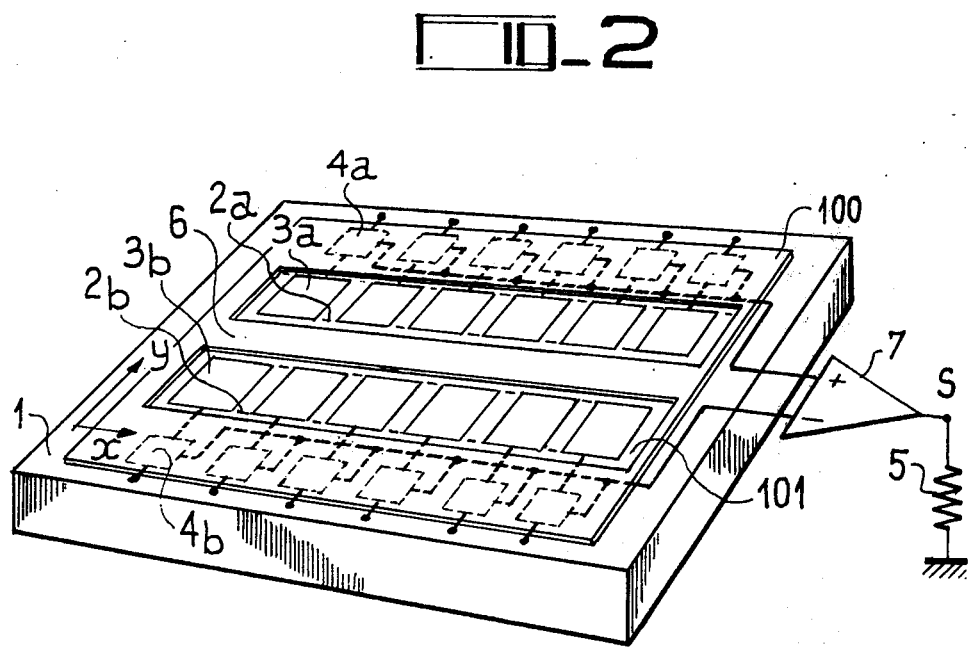
FIG_2

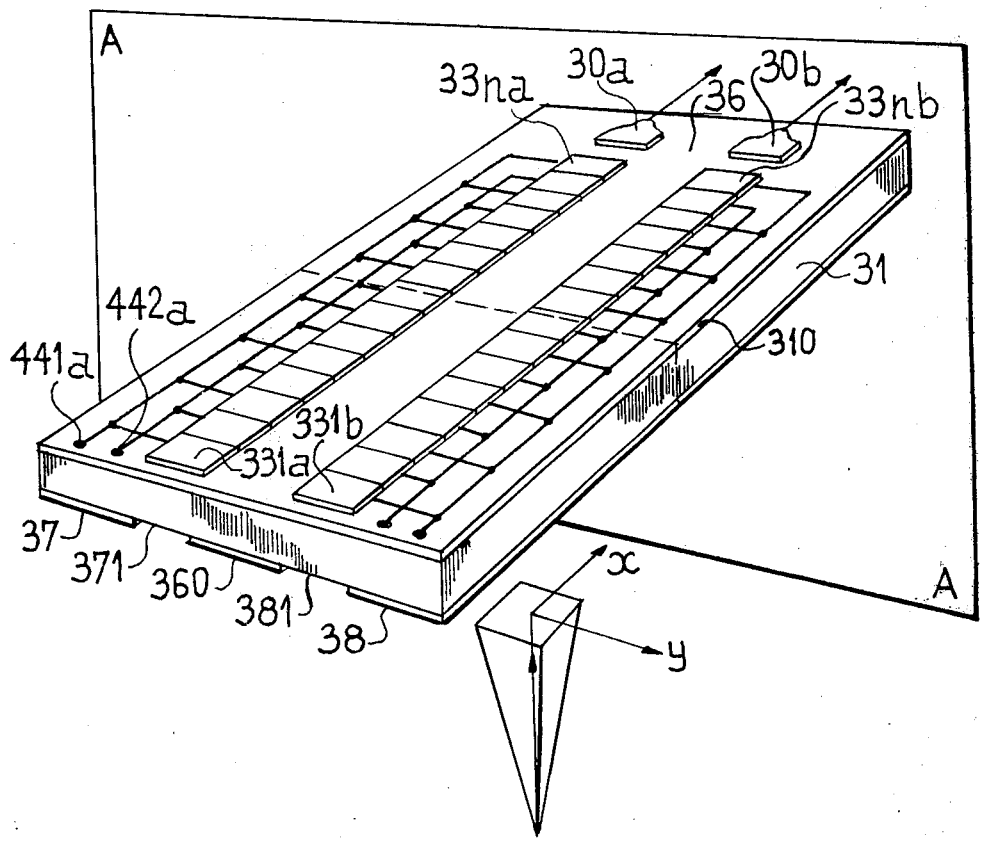
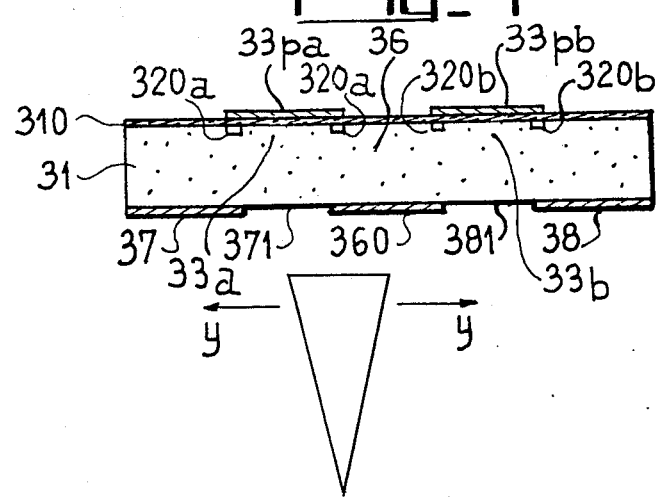

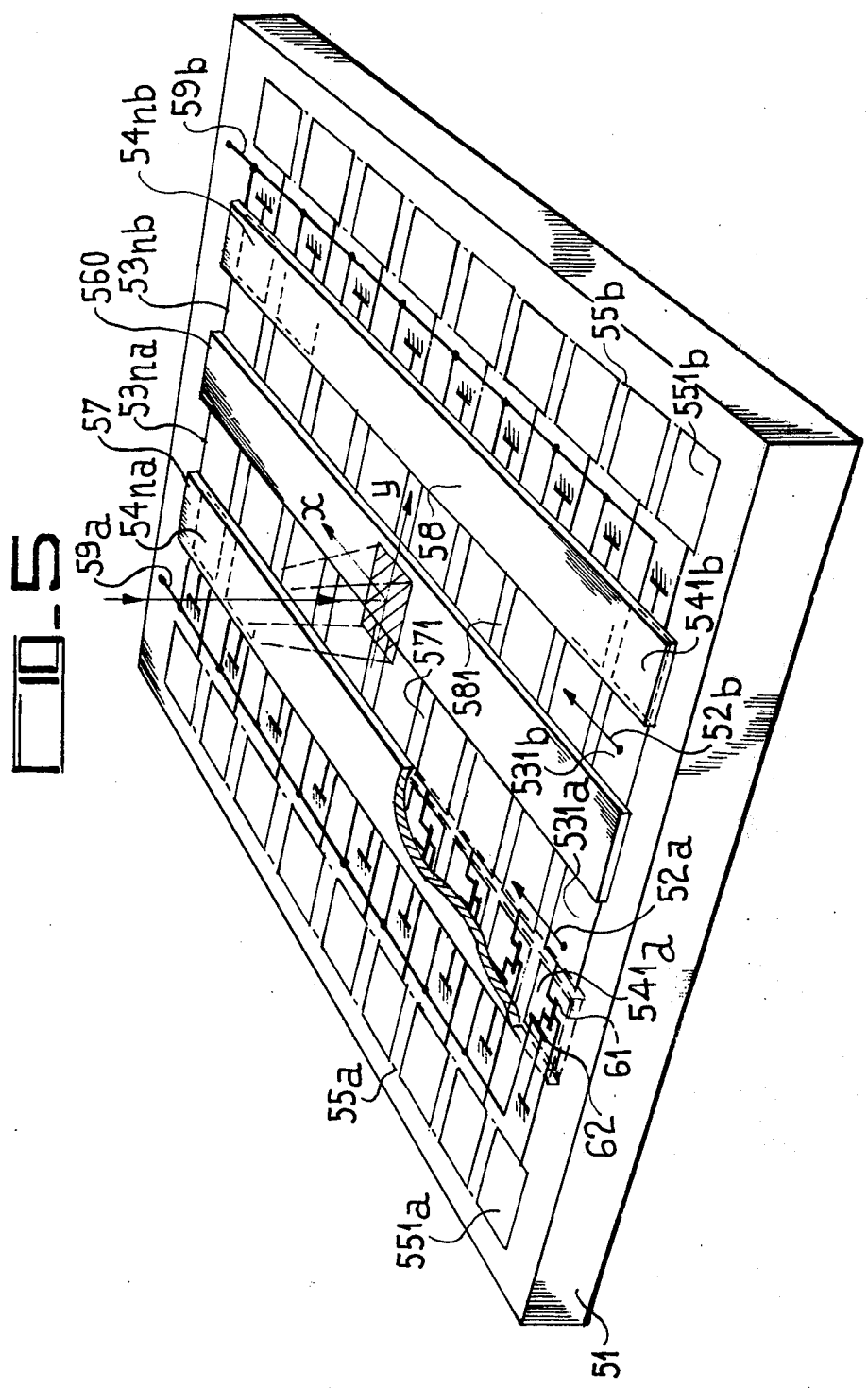

DEVICE FOR DETECTING THE DEFLECTION SIGNAL OF THE ELECTRON BEAM GENERATED BY AN ELECTRON-GUN IN AN OSCILLOSCOPE

The present invention relates to a device for detecting the very high frequency deflection signal for deflecting the electron beam produced by an electron-gun, in particular the electron-gun of a cathode-ray oscilloscope.

The optimising of the operation of an oscilloscope having a high cut-off frequency requires the making of a compromise between the values of the following parameters: tracing speed, sensitivity, resolutions, operating voltage.

The relationships between these parameters lead to the use of a high operating voltage for a high tracing speed, and this by contrast brings about a reduction in the sensitivity of conventional oscilloscopes.

A high tracing speed can only be achieved if a high-intensity beam is used and this in turn brings about a reduction in the resolution of the oscillogram.

Finally, in an oscilloscope having a high cut-off frequency, the transit time of the electrons through the deflection space is comparable to the duration of the signal and for a sinusoidal signal having a period T close to this transit time, and integrated deviation $$D = \int_0^T D(t) \, dt$$

is close to zero.

Various solutions have been applied to these problems, in particular:

the application of the operating voltage or the electron accelerating voltage, exclusively beyond the space in which the electron beam is deflected, in order thus not to reduce the oscilloscope sensitivity;

the use of a cathode-ray screen having a very fine grain associated with a very fine spot of the order of two microns in diameter, and the display of the trace obtained in this fashion with the help of a photographic apparatus comprising a plate with a highspeed emulsion;

oscilloscopes having deflection plates with distributed constants, enabling an increase in the deflection sensitivity to be achieved;

oscilloscopes whose screen is replaced by a silicon plate containing a mosaic of PN junctions previously charged to a voltage in the order of 10 volts by the method used in the vidicon-type camera tube. These junctions are discharged by the electron-hole pairs created in their volume by the energetic electrons of the beam, and are then recharged to the original potential by the same read-out process used in the aforesaid vidicon tubes. The video recharging current faithfully represents the signal in a system of coordinates x, y, the instrument of measurement being marked in accordance with the horizontal displacement of the spot, while the vertical displacement of the latter measures the amplitude.

The foregoing device, whose use is limited in frequency by the large deflections taking place during the scanning of a signal corresponding to the full dynamic range, requires the simultaneous use of a television screen.

The device which employs a cathode-ray screen with very fine grain and a spot of very small diameter, requires an amplification which can be obtained by using a photographic plate or by using an image-intensifier tube.

Another known solution consists in applying the signal through the modulating electrode of an electron-gun producing a beam which scans a charge transfer device. The signal recorded in the form of a points function can be read out with high precision. An amplified, sample representation of the signal is obtained at the spots of the charge transfer device. Scanning of the latter makes it possible to reconstituted a representation of the input signal, which is delayed or considerably slowed.

One limitation of this latter device arises from the difficulty of intensity-modulating a beam at high frequency and with a low-level signal, by applying the modulating signal to a modulating electrode.

The device which forms the object of the present invention makes it possible to overcome the aforesaid drawbacks and to exploit the advantages of certain known solutions such as the spread constants structure.

The object of the present invention is a device for detecting the signal deflecting the electron beam produced by an electron-gun, which comprises a target on a substrate of semiconductor material and means for scanning said target by the said electron beam, said target comprising on one of its faces a series of semiconductor elements generating electrical charge carriers under the effect of the bombardment produced by the electron beam, said semiconductor elements, considered in the direction of scanning of the beam, forming an array of elementary generators, and sequential read-out means for reading said elementary generators being provided in order to deliver the information corresponding to each of said elementary generators to a common load circuit.

Devices of this kind can be used in particular in cathode ray oscilloscopes for which a high cut-off frequency is required.

The invention will be better understood from a consideration of the ensuing description and drawings where the dimensions and proportions of the various constituent elements have not been respected simply in order to provide a better understanding of the overall arrangement, and where:

FIG. 1 illustrates the device forming the object of the invention;

FIG. 2 illustrates a particular embodiment of the object of the invention, which makes it possible to improve the performance of the device;

FIG. 3 relates to a device in accordance with the invention which employs a charge transfer device;

FIG. 4 illustrates a section through the device shown in FIG. 3, at the level of an electrode of order p;

FIG. 5 illustrates a special embodiment of the object of the invention.

In FIG. 1, the device forming the object of the invention comprises, within an evacuated enclosure which has not been shown, a target on a substrate made of semiconductor material. The electron beam 40 generated by the electron-gun 41 is directed onto the target and deflected in the direction y in proportion to the instantaneous value of the signal to be analysed. Scanning means illustrated schematically by 42 make it possible to scan the target by the electron beam, in the x direction which represents the time base. Deflection means shown schematically by 43 make it possible to deflect the electron beam in the y direction. The target comprises on one of its faces, opposite a window 101 in a plate 100 which is opaque to the electrons, a series of semiconductor elements 3 which generate electrical charge carriers under the effect of electron bombardment. The semiconductor elements 3, in the direction x in which the beam scans, form an array 2 of elementary generators. Sequential read-out means 4 furnish the information corresponding to each of the elementary generators, to a common load 5.

The operation of the device is as follows: Under the impact of the high-energy electrons of the beam, the charge carriers created at each elementary generator generate a signal proportional to that fraction of the right section of the beam which is intercepted by the element 3, and representative of the position of the beam in the deflection direction y. The scanning of the target in the direction x makes it possible to reconstitute the deflection signal in time, at each elementary generator, and therefore likewise the common load 5 to which the information corresponding to each elementary generator is supplied.

In accordance with a variant embodiment of the object of the invention shown in FIG. 2, the array of elementary generators opposite the windows 101 and a plate 100 opaque to the electrons, comprises, superimposed considered in the y direction of deflection of the beam, two rows 2a and 2b of elementary generator means separated by a zone 6 insensitive to the high-energy electrons of the beam. The electron beam is focussed on the insensitive zone 6 when at rest. Sequential read-out means 4a, 4b associated with each elementary generator furnish the corresponding information to a common load 5 through the medium of a differential amplifier. The differential amplifier has its difference mode inputs respectively connected to the common output of the elementary generators in a row 2a and 2b.

Operation of the system is as follows:

Under the impact of the high-energy electrons of the beam, the charge carriers created at each elementary generator generate a signal proportional to that fraction of the right section of the beam which is intercepted by an elementary generator, and representative of the position of the beam in the y direction.

A device of this kind, whose output is in a differential arrangement makes it possible to improve the linearity of the device.

FIGS. 3 and 4 relate to a special embodiment of the invention using two charge transfer devices on a substrate made of semiconductor material 31. The substrate can be made of either N-type or P-type semiconductor material, it does not matter which. In the case where the semiconductor material is N-type silicon, one of the faces of said first faces of the substrate carries a layer of insulating material, silicon oxide or silicon nitride, performing the function of a dielectric. The first face of the substrate comprises rectangular transfer electrodes 331a to 33na and 331b to 33nb. These electrodes form on the first face of the substrate two arrays which are parallel to the direction x of scanning of the beam and separated from one another by an inactive rectangular band 36 of given size in the direction y of deflection of the beam. The transfer electrodes 331a to 33na and 331b to 33nb are connected to phase electrodes 441a, 442a and 441b, 442b. In the example shown in FIG. 3, the two charge transfer devices are two-phase devices. Devices of one-phase or three-phase kind fall within the scope of the invention, however. The phase electrodes 441a, 442a and 441b, 442b are connected to a single transfer control generator not shown in FIG. 3.

That face of the substrate which is opposite to the first face and generally referred to as the second face, comprises a central screen 360 and two lateral screens 37 and 38 which are opaque to the high-energy electrons of the beam. These screens are for example constituted by metallised zones of sufficient thickness taking into account the accelerating voltage of the electrons in the beam, these metallised zones being deposited upon an insulating layer which electrically insulates them from the semiconductor material. The central and lateral screen form a set of rectangular bands parallel to the x direction of scanning of the beam and separated by two zones 371, 381, which are transparent to the beam electrons. In the quiescent state, in the absence of any deflection, the electron beam is focussed on the central screen 360.

The arrays formed by the transfer electrodes 331a to 33na and 331b to 33nb located on said first face of the substrate, are opposite the zones 371, 381 on the second face which are transparent vis-a-vis the electrons, while the central screen 360 is located opposite the band 36 of given dimension in the y direction of scanning, on the first face. The central screen 360 delimits in the substrate in association with the band 36, the zone which is insensitive to the high-energy electrons of the beam.

Said first and second faces of the substrate are parallel to one another and separated by a small substrate thickness, preferably less than 25μ.

In accordance with FIG. 4, the substrate 31 of semiconductor material comprises within its thickness highly defined n-doped bands produced by diffusion. These bands 320a and 320b are parallel to the x direction of scanning and located at the edge of the arrays of transfer electrodes and the storage sites. These bands provide better definition of the transfer space associated with the charge-transfer devices.

The electron beam, focussed in the quiescent state on the central screen 360, has a rectangular section whose dimension, at the level of the screen and in the direction y of deflection of the beam, is virtually identical to the dimension, in the same direction, of the zone which is insensitive to the high-energy electrons, as well as of the central screen 360.

In fact, the dimension of the beam in the direction y is chosen slightly greater than that of the screen 360 so that the beam, when focussed centrally on the screen 360 in the quiescent state, slightly overlaps at either side onto the zones 371 and 381 which are transparent to the electrons. The linearity of the output signal is thus improved and the absence of the output signal when the beam is not deflected can be ensured by adjusting the quiescent position of the beam on the central screen 360.

The dimensions of the section of the beam at the level of the screen 360, in a particular embodiment of the invention as shown in FIGS. 3 and 4, are for example 100 by 20μ.

The major dimension, 100 microns, is parallel to the y deflection direction of the beam and the minor dimension, 20 microns, parallel to the x deflection direction and in the same order of magnitude as an element of resolution of the charge transfer device, constituted by a group of three successive electrodes in a charge transfer device having three phases, or by a group of two double electrodes in the case of a charge transfer device of two-phase design. In order to ensure that a wider deflection dynamic range is achieved, the major dimension of the beam section may be increased. The beam can then be formed by superimposing several contiguous object diaphragms placed in proximity of the point of convergence, or in other words, the cross-over point, of the electron beam.

The zones 371–381 which are transparent to the high-energy electrons of the beam form rectangular bands whose dimension in the y direction is virtually identical to that of the beam in this same direction.

Each charge transfer device comprises at the end of the arrays formed by the charge transfer electrodes, a connecting electrode 30a and 30b connected to the difference mode inputs of a differential amplifier not shown in FIG. 3 but integrated in the substrate for example.

The operation of the device is as follows:

After a preparatory phase consisting of the application to the transfer electrodes 331a to 33na and 331b to 33nb of appropriate voltage through the medium of the phase electrodes 441a, 442a and 441b, 442b, this, depending upon the direction of scanning, bringing about a distribution of potential wells, decreasing in the x scanning direction and capable of storing the charge corresponding to the beam deflection, the deflection signal in question triggers the scanning operation and is applied to the fast deflection plates (cut-off frequency of the order of 3 GHz) after passing through a delay line designed to compensate for the delay in triggering the scanning function.

Depending upon whether the signal has a positive or negative value, the beam is deflected upwards or downwards and generates in the charge transfer devices charges which appear at the level of the transfer electrodes.

The modulation of the position of the beam in the y direction, the beam also being scanned in the x direction during a period of time, records a state of charges within the body of the semiconductor material substrate 31 constituting the two charge transfer devices. Each of the charge transfer devices, depending upon the corresponding deflection of the beam, receives a virtually instantaneous piece of information when the beam passes. This information is physically represented by the number of charge carriers generated at the level of a resolution element of each charge transfer device, by the electron beam bombardment. The number of charge carriers is proportional to the sensitive area scanned by the beam and to the time for which the beam bombards a given elementary area. Thus, a linear relationship appears between the electron beam deflection signal and the number of charge carriers generated at a resolution element in the charge transfer devices.

These two charge transfer devices can then store the charges at each resolution element for a time of the order of some ten milliseconds, during which the charges generated by the scanning of the electron beam are stored unaffected by parasitic charges due to the thermally generated current in the space charge zone located beneath the transfer electrodes.

After a time which is adjustable at will within the limit of the storage time of the charge transfer devices and of the non-appearance of parasitic charges, synchronous transfer signals of clock frequency, corresponding to a linear velocity in the x direction, which is very much slowed down in relation to the scanning rate of the beam, are applied to the transfer electrodes of the two charge transfer devices through the medium of the phase electrodes 441a, 442a and 441b, 442b, connected to one and the same charge transfer generator, not shown in FIG. 3. These transfer signals make it possible to analyse the number of charges, positive in the case of the embodiment shown in FIG. 3, received by each group of electrodes, and to furnish a corresponding current at the output collecting electrode 30a and 30b. The rate of read-out is fixed for example at $10^{-6}$ seconds per group of transfer electrodes. For charge transfer devices comprising 1000 signal samples, read-out is effected in $10^{-3}$ secs.

The absolute value of the output signal from the charge transfer device depends upon the intensity of the beam and upon the gain value of the electron-multiplication mechanism taking place in the semiconductor material at each elementary generator. Because of the very small deflection for the maximum signal, equal to the dimension in the y direction of the zones which are transparent to the electrons, namely 100 microns in the embodiment shown in FIG. 3, substantial sensitivities can be envisaged at scanned frequencies of the order of 2GHz.

The dimensioning of the groups of transfer electrodes forming the resolution elements of the charge transfer devices, depends upon the dynamic deflection range in the y direction, upon the electron-multiplication gain and upon the intensity of the electron beam.

For example, for a minimum signal of 100 high-energy electrons, an amplification gain of 3000 and a dynamic range of 100, groups of transfer electrodes to pass three times $10^7$ electrons will have to have dimensions of the order of 500 by 30 microns.

In accordance with another embodiment shown in FIG. 5, the elementary generator elements are constituted by diodes 531a to 53na and 531b to 53nb, biased in reverse. This reverse biasing can be achieved by means of an associated electron-gun or by means of the electron-gun which produces the actual trace. The diodes 531a to 53na and 531b to 53nb form upon one face of the substrate 51 of semiconductor material, two arrays 52a and 52b represented by the arrows and parallel to the beam scanning direction. The two arrays or rows of diodes are separated by a rectangular band of given dimension in the y deflection direction of the beam. A central screen 560 and two lateral screens 57 and 58 which are opaque to the high-energy electrons of the beam, form upon said surface of the substrate a set of rectangular bands parallel to the x direction of scanning. The bands formed by the screens 560 and 57, 58, are separated by two zones 571, 581, which are transparent to the high-energy electrons of the beam when the latter is focussed on the central screen 560 in the quiescent state.

The diodes are constituted by zones of rectangular shape diffused for example from said surface of the substrate. The arrays 52a and 52b constituted by the diodes, coincide with the zones which are transparent to the high-energy electrons of the beam, and the central screen 560 coincides with the rectangular band separating the two arrays and delimits on said face the zone which is insensitive to the high-energy electrons of the beam.

That face of the substrate which contains the diodes 531a to 53na and 531b to 53nb, and the central and lateral screens too, are directed towards the electron-gun. In a special embodiment in accordance with FIG. 5, the diodes are PN diodes whose face P is disposed towards the electron-gun. The electron-gun is biased by a negative voltage of the order of 10 volts in relation to the surface of the diodes, prior to scanning and deflection of the electron beam. In the embodiment shown in FIG. 5, the sequential read-out means are constituted by a circuit 541a picking off samples of the signal, associated with each of the diodes. Each of the pick-off circuits is controlled by a stage 551a. . . , 551b of a shift-register 55a and 55b, these likewise being protected by a screen which is opaque to the electrons, and corresponding to each of the two rows of diodes. The shift registers 55a and 55b are controlled synchronously by one and the same read-out generator, not shown in FIG. 5. In accordance with a special embodiment, pick-off circuits 541a to 54nb, 541b, to 54nb picking off signal samples, are arranged beneath the lateral screens 57, 58 and are thus protected from electron bombardment. These pick-off circuits are each constituted by two field-effect transistors 61 and 62 connected in cascade. The transistor 51 controlled by the corresponding stage of a shift-register, performs the function of a switching gate between the diode 531a and the control electrode of the transistor 62, between which it is connected. The output electrode of the transistor 62 is connected through the medium of a connecting electrode 59a, 59b to one of the difference mode inputs of a differential amplifier which has not been shown. In the same fashion as in the case of the embodiment of FIGS. 3 and 4, the electron beam has a cross-section whose dimension in the direction y is virtually identical to the dimension, in the same direction, of the central screen 560 and the rectangular diodes have a dimension, in the same direction y, virtually identical to that of the cross-section of the electron beam in said same direction.

The operation of the embodiment shown in FIG. 5 is as follows:

In a first phase, the diodes are charged to a voltage in the order of 10 volts. This bias can be brought about as before, by means of an associated electron-gun or by means of the actual electron-gun which produces the trace. The biasing is such that that face, a P-type face, disposed towards the electron-gun is negative in relation to the other face, which is an N-type face. The scanning and deflection signals are then applied to the beam. The high-energy electrons of the beam focussed on the diffused P-type region of the reverse-biased PN junctions, generate charge carriers during scanning, whose effect is to discharge the diodes. The discharging of the diodes is again in a linear relationship with the deflection signal applied, along the y axis, to the electron beam producing the trace.

After the electron beam has passed, the diodes can retain the generated charges in storage for a time in the order of 10 milliseconds without serious degradation.

This time is sufficient to enable delayed read-out of the recording at a reduced speed.

To this end, a generator controlling read-out, constituted by a clock, synchronously controls the shift-registers 55a and 55b. Each stage successively, at the read-out rate, controls the conducting of each of the transistors 61 in the pick-off devices 541a to 54na and 541b to 54nb, and the transmission of the corresponding signal samples amplified by the transistor 62, to the differential amplifier which has not been shown.

The shift-registers do not perform any precision function as far as the amplitude of the signals is concerned. They can be integrated into the substrate in the same fashion as the rows of diodes. Precautions are taken as far as the emission of secondary electrons created by electron bombardment of the target, is concerned. For example, a set of conductive plates raised at a voltage slightly higher than the potential of the diodes themselves, can be arranged in proximity to the lateral plates, the conductive plates not obscuring the maximum deflection space swept by the beam.

In accordance with a variant embodiment of the object of the invention, the shift-registers 55a and 55b are replaced by two charge transfer devices which make it possible to transfer charges stored in each diode and transmit the corresponding information. Then, each diode is used to control the introduction of charges into each group of electrodes forming the resolution element of the charge transfer devices. The introduction of the charges is performed through the medium of an input diode and two input electrodes. The signal is applied in the form of a potential difference between the electrodes. A negative voltage applied to the input diode thus empties the first input electrode, leaving the charges corresponding to the signal beneath the second input electrode. These charges are then directed beneath the input spot of the charge transfer device, by the application of a potential to its control electrode.

The device in accordance with the invention makes it possible, in particular where detection of the signal deflecting the electron beam produced by an electron-gun is concerned, to exploit the extremely fast response characteristics of deflection plates of spread constant kind, plates in fact of serpentine design, in order to improve the deflection sensitivity of current oscilloscopes, the maximum signal being obtained for a very small displacement, of the order of 100 microns, on the part of the spot producing the trace. It makes it possible furthermore to achieve a cut-off frequency of the order of 5 to 10 GHz for a very much lower cost of manufacture than that entailed by known embodiments of this kind of equipment.

What is claimed is:

1. A device for detecting the deflection signal of the electron beam produced by an electron-gun comprising:
a target on a semiconductor material substrate and means for scanning said target by the electron beam, said target comprising upon one of its faces a series of semiconductor elements generating electrical charge carriers under the effect of bombardment by the electron beam, said semiconductor elements, considered in the direction of scanning of the beam, forming an array of elementary generators,
means for reading out sequentially said elementary generators, said array of elementary generators comprising, superimposed in the direction of deflection of the beam and perpendicular to the direction of scanning of the beam, two rows of elementary generator means, the rows being separated by a zone which is insensitive to the high-energy electron beam when said latter is focussed on said zone in the quiescent state, said means for reading out sequentially said elementary generators realizing a delayed read-out of said generators and furnishing in operation the information from the corresponding elementary generator to a common load.

2. A device as claimed in claim 1 wherein said means for reading out sequentially said elementary generators furnish, when operating, the information from the corresponding elementary generator through the medium of a differential amplifier.

3. A device as claimed in claim 1 wherein said elementary generator means separated by a zone insensitive to the high energy electrons consist of:
   two charge transfer devices on a substrate of semiconductor material said transfer devices having rectangular transfer electrodes and phase electrodes forming upon a first face of the substrate two arrays parallel to the direction x of scanning of the beam and separated by a rectangular band of given dimension in the direction y of deflection of the beam;
   a central screen and two lateral screens opaque to the high energy electrons of the beam, forming upon a second face of the substrate, opposite to its first and parallel to the latter, an assembly of rectangular bands parallel to the x direction of scanning of the beam and separated by two zones transparent to the high energy electrons of the beam, said beam being focussed on the central screen in the quescient state.

4. A device as claimed in claim 3, wherein the arrays formed by the transfer electrodes located on said first face of the substrate are opposite said transparent zones of the second face, said central screen being located opposite said band, on the first face, which has a given dimension in the y direction, said central screen delimiting in relation with said band the zone which is insensitive to the high energy electrons of the beam.

5. A device as claimed in claim 3, wherein said means for reading out sequentially said elementary generators comprise a transfer control generator connected to said phase electrodes of the transfer electrodes.

6. A device as claimed in claim 4, wherein said electron beam, focussed at rest on said central screen, has a rectangular section whose dimension in the direction of deflection of the beam is virtually identical to the dimension in the same direction of the zone which is insensitive to the high energy electrons.

7. A device as claimed in claim 6, wherein said zones which are transparent to the high energy electrons of the beam and which are located on said second face form rectangular bands whose dimension, in the direction y of deflection of the beam, has a value virtually identical to that of said beam section in said same direction.

8. A device as claimed in claim 1, wherein said elementary generator means separated by a zone insensitive to the high energy electrons of the beam consist of:
   reversed biased diodes forming upon one face of the substrate two arrays which are parallel to the x direction of scanning of the beam and separated by a rectangular band of given dimension in the direction y of deflection of the beam;
   a central screen and two lateral screens opaque to the high energy electrons of the beam forming on said face of the substrate a set of rectangular bands parallel to the x direction of scanning of the beam and separated by two zones transparent to the high energy electrons of the beam, said beam being focussed in operation on said central screen in the quiescent state.

9. A device as claimed in claim 8, wherein the arrays formed by the diodes located upon one face of the substrate coincide with those zones of said face which are transparent to the high energy electrons of the beam, said central screen delimiting upon said face said zone which is insensitive to the high-energy electrons of the beam.

10. A device as claimed in claim 8, wherein said diodes are PN diodes the P type face of which is disposed towards the electron gun.

11. A device as claimed in claim 8, wherein said means for reading out sequentially said elementary generators consist of:
   circuits for picking off samples of the signal generated by each of said diodes and
   a stage of a shift register for controlling said circuits for picking off samples of said signals, said stage of shift register being connected to read out control generator.

12. A device as claimed in claim 11, wherein said circuits for picking off samples of said signals consist of:
   a first second field effect transistors connected in cascade said first and a field effect transistor controlled by a corresponding stage of the shift register being connected between a diode and the control electrode of said second transistor, said second field effect transistor having an output electrode connected to one of the difference mode inputs of said differential amplifier through the medium of a connecting electrode.

* * * * *